(12) United States Patent
Baillargeon et al.

(10) Patent No.: US 6,326,646 B1
(45) Date of Patent: Dec. 4, 2001

(54) MOUNTING TECHNOLOGY FOR INTERSUBBAND LIGHT EMITTERS

(75) Inventors: James Nelson Baillargeon, Springfield; Federico Capasso, Westfield; Alfred Yi Cho, Summit; George Sung-Nee Chu, Murray Hill; Claire Gmachl, Millburn; Albert Lee Hutchinson, Piscataway; Arthur Mike Sergent, New Providence; Deborah Lee Sivco, Warren; Alessandro Tredicucci, Summit, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/448,929

(22) Filed: Nov. 24, 1999

(51) Int. Cl.[7] .................................................. H01L 33/00
(52) U.S. Cl. .................................. 257/94; 372/44; 438/29
(58) Field of Search ................................ 372/44; 257/94; 438/29, 33

(56) References Cited

U.S. PATENT DOCUMENTS

| 4,276,098 | 6/1981 | Nelson et al. ........................ 148/171 |
| 4,748,482 | * 5/1988 | Collins ................................... 357/17 |
| 5,088,105 | * 2/1992 | Scifres et al. ........................... 372/92 |
| 5,457,709 | 10/1995 | Capasso et al. ......................... 372/45 |
| 5,509,025 | 4/1996 | Capasso et al. ......................... 372/45 |

OTHER PUBLICATIONS

Faist et al., Quantum Cascade Laser, Science, vol. 264, pp. 553–556 (Apr. 1994).
Voss et al., Time–resolved . . . , J. Appl. Phys., vol. 79, No. 2, pp. 1170–1172 (Jan. 1996).
Capasso et al., Infrared (4–11 $\mu$m) . . . , Solid State Comm., vol. 102, No. 2–3, pp. 231–236 (1997).
Scarmacio et al., High–Power Infrared . . . , Science, vol. 276, pp. 773–776 (May 1997).
Faist et al., High–Power Continuous . . . , IEEE J. Quant. Electron., vol. 34, No. 2, pp. 336–343 (Feb. 1998).
Gmachl et al., High power $\lambda \approx 8$ $\mu$m . . . , Appl. Phys. Lett., vol. 72, No. 24, pp. 3130–3132 (Jun. 1998).
Sirtori et al., Long–wavelength . . . , Optics Lett., vol. 23, No. 17, pp. 1366–1368 (Sep. 1998).

(List continued on next page.)

*Primary Examiner*—Olik Chaudhuri
*Assistant Examiner*—Douglas A. Wille
(74) *Attorney, Agent, or Firm*—Michael J. Urbano

(57) ABSTRACT

A mounting technology that increases the cw operating temperature of intersubband lasers, without increasing the risk of hot spots near the facets and short circuits near the perimeter of the laser chip, is described. In accordance with one embodiment of our invention, a method of fabricating a intersubband semiconductor laser comprises the steps of providing a single crystal semiconductor substrate, forming on the substrate an epitaxial region that includes a core region and an intersubband active region in the core region, forming front and back facets that define an optical cavity resonator, forming a metal electrode on the epitaxial region so as to provide an electrical connection to said active region, and mounting said laser on a heat sink, characterized in that the mounting step includes the steps of (i) soldering the electrode to the heat sink so that the front facet overhangs an edge of the heat sink and (ii) cleaving off the overhanging portion of the laser so as to form a new front facet that is essentially flush with the edge of said heat sink. In accordance with another embodiment, our invention is further characterized in that metal electrode to the epitaxial region is recessed from the edges of the laser chip. In accordance with yet another embodiment, our invention is further characterized in that the back facet of the laser is coated so that any solder that might tend to creep onto the back facet contacts the coating and not semiconductor material (in particular the ends of the active region).

12 Claims, 5 Drawing Sheets

OTHER PUBLICATIONS

Tredicucci et al., High performance . . . , Appl. Phys. Lett., vol. 73, No. 15, pp. 2101–2103 (Oct. 1998).

Slivken et al., Relaxation kinetics . . . , J. Appl. Phys., vol. 85, No. 2, pp. 665–671 (Jan. 1999).

Bewley et al., High–temperature . . . , Appl. Phys. Lett., vol. 74, No. 8, pp. 1075–1077 (Feb. 1998).

Gmachl et al., Dependence . . . , IEEE J. Sel. Top. in Quant. Electron., vol. 5, No. 3, pp. 808–816 (May/Jun. 1999).

Capasso et al., Quantum cascade lasers, Physics World, pp. 27–31 (Jun. 1999).

Gmachl et al. Improved CW . . . , IEEE Photonics Tech. Lett., vol. 11, No. 11, pp. 1369–1371 (Nov. 1999).

* cited by examiner

MOUNTING TECHNOLOGY FOR INTERSUBBAND LIGHT EMITTERS

GOVERNMENT CONTRACTS

This invention was made with Government support under Contract No. DAAG55-98-C0050 awarded by the DARPA/ US Army Research Office. The Government has certain rights in this invention.

FIELD OF THE INVENTION

This invention relates generally to semiconductor light emitters and, more particularly, to techniques and designs for mounting intersubband (ISB) light emitters on heat sinks.

BACKGROUND OF THE INVENTION

As described by F. Capasso et al. in *Solid State Communications*, Vol. 102, No. 2–3, pp. 231–236 (1997) and by J. Faist et al. in *Science*, Vol. 264, pp. 553–556 (1994), which are incorporated herein by reference, a quantum cascade (QC) laser is based on intersubband transitions between excited states of coupled quantum wells and on electron transport as the pumping mechanism. Unlike all other semiconductor lasers (e.g., diode lasers), the wavelength of the lasing emission of a QC laser is essentially determined by quantum confinement; i.e., by the thickness of the layers of the active region rather than by the bandgap of the active region material. As such it can be tailored over a very wide range using the same semiconductor material. For example, QC lasers with InAlAs/InGaAs active regions have operated at mid-infrared wavelengths in the 3.5 to 17 $\mu$m range. In diode lasers, on the contrary, the bandgap of the active region is the main factor in determining the lasing wavelength. Thus, to obtain lasing operation at comparable infrared wavelengths the prior art has largely resorted to the more temperature sensitive and more difficult-to-process lead salt materials system.

More specifically, diode lasers, including quantum well lasers, rely on transitions between energy bands in which conduction band electrons and valence band holes, injected into the active region through a forward-biased p-n junction, radiatively recombine across the bandgap. Thus, as noted above, the bandgap essentially determines the lasing wavelength. In contrast, the QC laser relies on only one type of carrier; i.e., it is a unipolar semiconductor laser in which electronic transitions between conduction band states arise from size quantization in the active region heterostructure.

Although relatively short wavelength (e.g., $\leq 3\ \mu$m) diode lasers routinely operate continuous wave (cw) at room temperature and above, QC lasers at present do not. Rather, at these relatively high temperatures they are operated only in a pulsed mode due to their relatively low wall-plug efficiencies ($\leq 1\%$) and their relatively large electrical power dissipation ($\leq 10$ W). The latter originates from the high operating voltage and/or current (e.g., 5–10 V at 1 A). The highest reported cw operating temperature for QC lasers emitting at wavelengths of 5–8 $\mu$m is ~150–160 K. However, for many applications, e.g., high resolution gas sensing, it would be highly desirable to have a QC laser capable of operating cw at higher temperatures so as to reduce the electrical power requirements on the cooling system used and to enhance the laser performance.

One of the factors that significantly affects the highest temperature at which a semiconductor laser can operate cw is the heat sinking technology used to extract heat from the active region of the device. The laser may be mounted on a heat sink either with its substrate side down (i.e., with the relatively thick substrate mounted on the heat sink) or with its epitaxial side down (i.e., with the relatively thinner epitaxial region, grown on the substrate, mounted on the heat sink). The latter approach has the advantage that the active region, which is formed in the epitaxial region, is placed in closer proximity to the heat sink than it would be in the case of substrate-side mounting. Consequently, heat extraction from the active region is enhanced, and higher temperature and higher power operation is possible. Illustrative of fairly current investigations into epitaxial-side mounting of semiconductor lasers are papers by Bewley et al., *Appl. Phys. Lett.*, Vol. 74, No 8, pp. 1075-1077 (Feb. 1999) and Voss et al., *J. App. Phys.*, Vol. 79, No. 2, pp.1170–1172 (January 1996).

Although eptaxial-side mounting is an established technology, several problems arise in applying it to QC lasers, since conventional semiconductor laser diodes and QC lasers differ in several important respects.

First, QC lasers usually are not planar because significant optical and current confinement is necessary to obtain a low threshold current and, in turn, a low dissipated power at the lasing threshold. Thus, QC lasers are commonly deep etched, ridge waveguide structures, with a ridge height ~5 $\mu$m. The side-walls of the ridge are typically covered with an electrical insulation layer (e.g., 300 nm of $Si_3N_4$ or $SiO_2$). On top of the laser ridge and the insulation layer typically 30 nm/300 nm of Ti/Au are deposited. This metallization has open gaps along the ridge to facilitate cleaving of the laser facets. The operating voltage of QC-lasers is typically ~5–10 V. Therefore, even slight damage to the insulating layer—as can occur when the devices are cleaved—will cause a local breakdown of the insulation when a 5–10 V bias voltage is applied across it. Once the insulation layer is damaged, the unipolar ridge waveguide QC laser structure, which typically does not contain any current blocking layers, experiences relatively large parasitic leakage currents (after the devices are soldered to a heat sink).

Finally, the entire area of the ridge in a QC laser needs to be in good thermal contact with the heat-sink to avoid the occurrence of "hot-spots", where—as a consequence of the large amount of dissipated heat—devices tend to break down catastrophically. Therefore, the solder-bonding has to be extended to the very end of the laser ridge in a way that does not electrically short-circuit the active region (which is directly exposed at the facets) and does not otherwise contaminate the facet with solder (in a way that would cause unwanted scattering of the laser radiation). Most conventional diode lasers, which dissipate much less power, avoid this problem by not being soldered to the very end of the laser chip.

Similar considerations apply to other types of ISB lasers/ emitters; e.g., superlattice (SL) QC lasers as described by Scamarcio et al., Science, Vol. 276, pp. 773–776 (May 1997), pre-biased SL lasers as described by Tredicucci et al., *Appl. Phys. Lett.*, Vol. 73, No. 15, pp. 3101–2103 (October 1998) and non-cascaded, single stage ISB lasers described by C. Gmachl et al., *Appl. Phys. Lett.*, Vol. 73, No. 26, pp. 3380–3382 (December 1998), all of which are incorporated herein by reference.

Thus, a need remains in the ISB laser art for a heat sink mounting approach that raises the temperature at which the lasers can operate cw, yet does so without increasing the risk of either short circuits at the facets or hot spots at the ends of the laser chips.

SUMMARY OF THE INVENTION

This need is addressed in accordance with one aspect of our invention, a mounting technology that increases the cw operating temperature of intersubband lasers without increasing the risk of hot spots near the facets and short circuits near the perimeter of the laser chip. In accordance with one embodiment, method of fabricating an intersubband semiconductor light emitter comprises the steps of providing a single crystal semiconductor substrate, forming on the substrate an epitaxial region that includes a core region and an ISB active region in the core region, forming front and back facets that define an optical cavity resonator (in the case of a laser), the active region being disposed in the resonator, forming a metal electrode on the epitaxial region so as to provide an electrical connection to the active region, and mounting the emitter on a heat sink, characterized in that the mounting step includes the steps of (i) soldering the electrode to the heat sink so that the front facet overhangs an edge of the heat sink and (ii) cleaving off the overhanging portion of the laser so as to form a new front facet that is essentially flush with the edge of the heat sink. In accordance with another embodiment, our invention is further characterized in that metal electrode to the epitaxial region is recessed from the edges of the laser chip. In accordance with yet another embodiment, our invention is further characterized in that the back facet of the emitter is coated so that any solder that might tend to creep onto the back facet contacts the coating and not semiconductor material (in particular the ends of the active region).

BRIEF DESCRIPTION OF THE DRAWING

Our invention, together with its various features and advantages, can be readily understood from the following more detailed description taken in conjunction with the accompanying drawing, in which.

Figure 1:
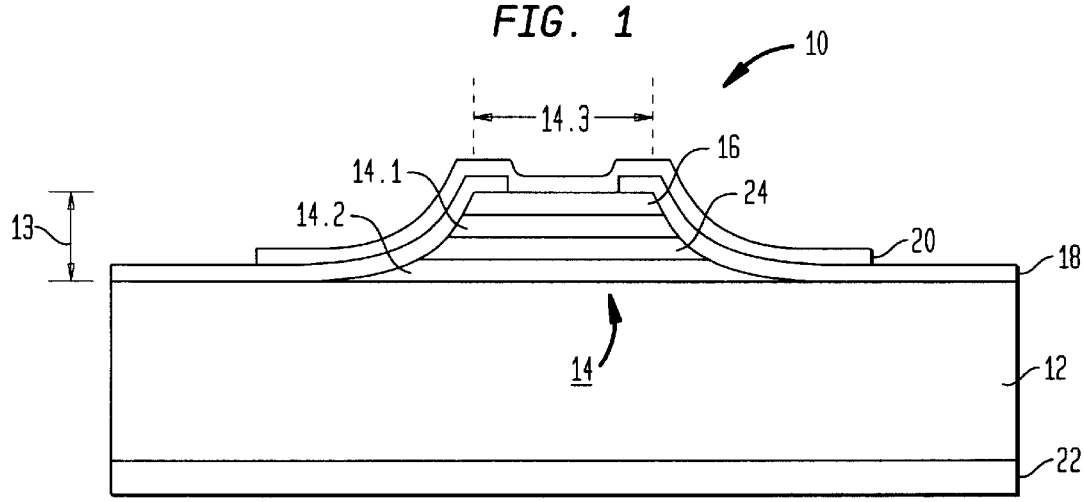
FIG. 1 is a schematic, cross-sectional view of an ISB emitter in accordance with one embodiment of our invention.

In the interest of clarity and simplicity, FIG. 1 has not been drawn to scale. In addition, when describing physical or optical dimensions, the symbol A stands for Angstroms, whereas when describing electric current, it stands for Amperes.

DETAILED DESCRIPTION OF THE INVENTION

General Structure

With reference now to FIG. 1, an ISB semiconductor light emitter/source 10 comprises a substrate 12 and an epitaxial region 13 grown thereon. The epitaxial region includes a core region 14 sandwiched between an upper cladding region 16 and the substrate 12 which serves as a lower cladding region. The core region includes an active region 24 sandwiched between a pair of regions 14.1 and 14.2, each having a refractive index that is high relative to that of the cladding regions. The epitaxial region 13 is illustratively formed in the shape of a mesa or trapezoid typical of ridge waveguide laser structures. The mesa may be shallow-etched so as to stop at the top of the active region 24, or, as shown, it may be deep-etched so that the mesa extends through the active region. The use of a mesa advantageously provides significant optical and current confinement which, in turn, enables the devices, when functioning as lasers, to operate with relatively low threshold current. However, it is feasible that the devices could be planarized; e.g., by forming current blocking layers on both sides of the mesa. Illustratively, the blocking layers may be include reverse-biased p-n junctions and/or Fe-doped InP layers. In either case, an electrically insulating layer 18 (e.g., $Si_3N_4$ or $SiO_2$) is formed over the top of the device and is patterned to form an opening which exposes a portion of the top of the mesa. A first electrode 20 is formed over the insulating layer 18 and in the opening so as to contact the upper cladding region (usually by means of a highly doped contact-facilitating layer, not shown), and a second electrode 22 is formed on the substrate 12.

Alternatively, the upper cladding region may be replaced by a plasmon-enhanced waveguide structure as described by Sirtori et al., *Optics Lett.*, Vol. 23, No. 17, pp. 1366–1368 (September 1998), which is incorporated herein by reference. Likewise, a lower cladding region, separate from the substrate, may be formed between the substrate and the active region.

Illustratively, light emitters of this type are fabricated from Group III-V compound semiconductors; e.g., GaInAs/AlInAs, GaAs/AlGaAs and others.

Drive circuitry, not shown, is coupled across the electrodes in order to provide an external voltage bias and to supply pumping energy (e.g., electric current) to the device of sufficient magnitude to generate light. The emitter operates as an incoherent, spontaneous emission source (akin to an LED), or it operates as a coherent, stimulated emission source. In the latter case, when provided with optical feedback, the source may function as a laser. Suitable optical feedback is typically provided by an optical cavity resonator formed, for example, by cleaved crystal facets, distributed feedback (DFB)gratings, distributed Bragg reflectors (DBRs), or a combination of them.

In some designs of a spontaneous emission source in accordance with our invention, the cladding regions may be omitted, especially if they absorb light at the operating wavelength of the device.

Active Region

The term ISB active region includes a single stage, non-cascaded device of the type described in a paper by Gmachl et al., supra. The term also includes a multiple stage, cascaded device of the type described in the Capasso et al. and Faist et al. papers, supra; i.e., a multiplicity of essentially identical radiative transition (RT) regions and a multiplicity of injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In addition, the term ISB active region is intended to embrace both diagonal lasing transitions as well as vertical lasing transitions. Diagonal transitions involve radiative transitions between upper and lower laser energy levels or states where the wave functions (the moduli squared) corresponding to the levels are substantially localized in different quantum wells of the same RT region. See, also U.S. Pat. No. 5,457,709, which is incorporated herein by reference. On the other hand, in the case of vertical transitions the excited and lower energy states are both substantially in the same quantum well of a single RT region. See, U.S. Pat. No. 5,509,025, which is also incorporated herein by reference. Both types of lasing transitions are also described in the article by F. Capasso et al., supra. This article, as well as the '025 patent, point out that the I/R regions of a vertical transition QC laser may include minibands and a minigap between the minibands to form an effective Bragg reflector for electrons in the excited state and to ensure swift electron escape from the lower states.

In addition, the source may be designed to operate at a single center wavelengths, as in the papers discussed above, or it may operate in multiple wavelengths as described, for example, by A. Tredicucci et al., *Nature*, Vol. 396, pp. 350–353 (November 1998), which is incorporated herein by reference.

Yet another ISB laser, known as a superlattice (SL) laser, can also benefit from implementation in accordance with our invention. In a SL laser the wave functions of the laser levels are spread over a multiplicity of quantum wells within each RT region. Laser action is achieved through unipolar injection by inter miniband tunneling. See, G. Scamarcio et al., supra. Pre-biased SLs are another type of ISB laser embraced by our invention. See, Tredicucci et al.,*App. Phys. Lett.*, supra.

Mounting Technology

Figure 2:
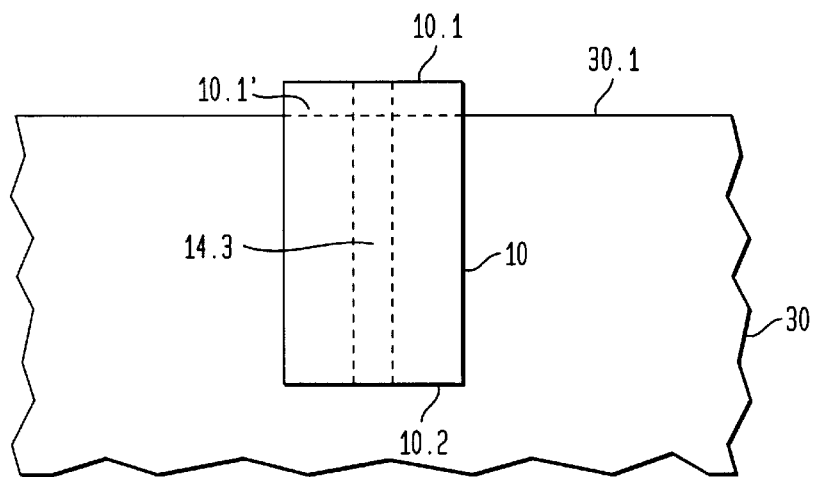
FIG. 2 is schematic, top view of an ISB emitter chip overhanging a heat sink in accordance with another embodiment of our invention.
Figure 3:
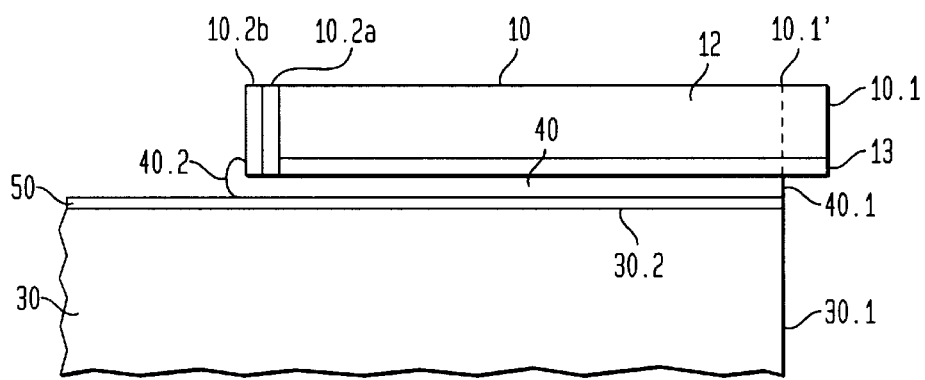
FIG. 3 is a schematic, side view of the ISB emitter chip of FIG. 2 showing the back facet coating in accordance with yet another embodiment of our invention.
Figure 4:
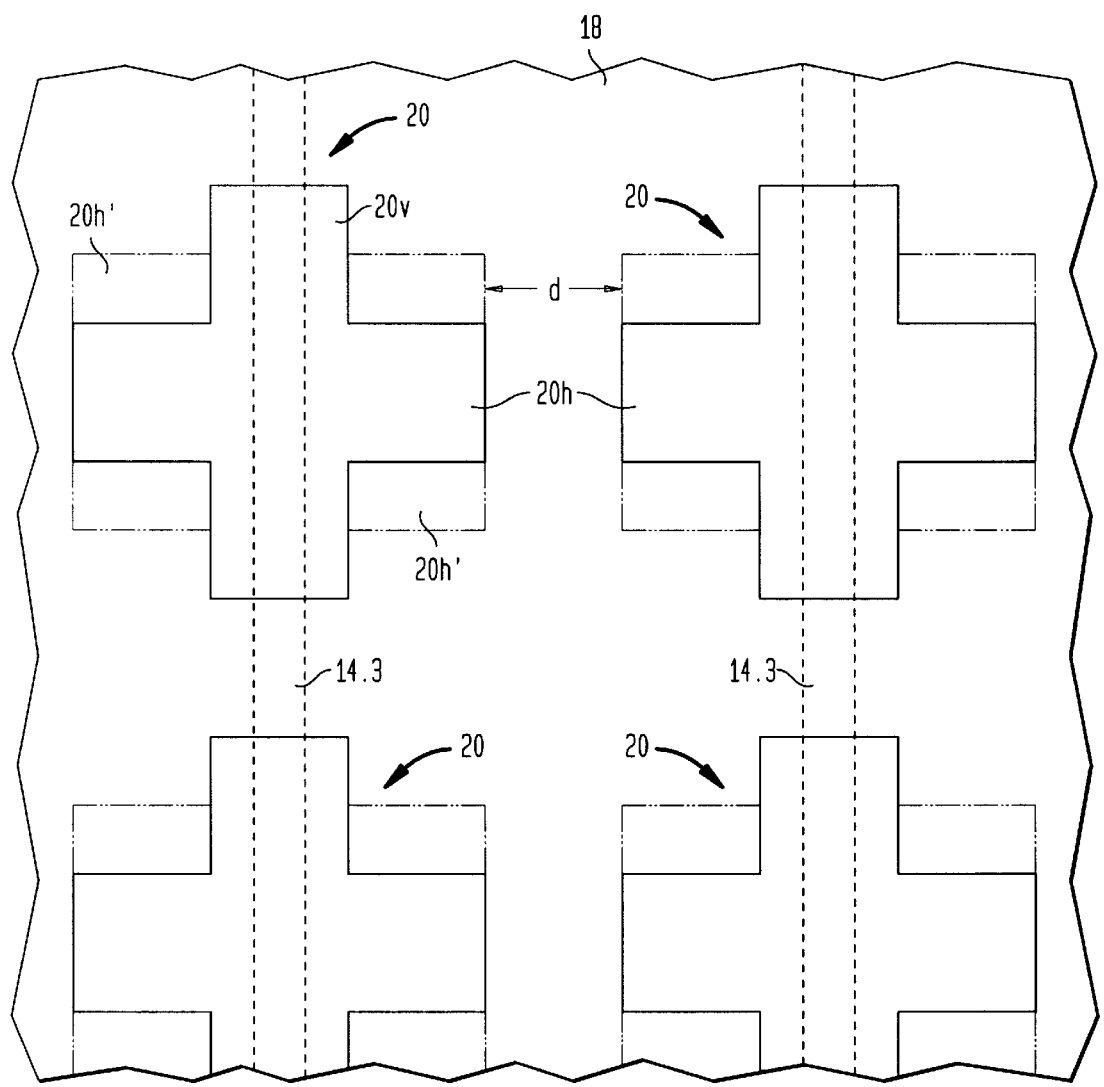
FIG. 4 is a schematic, top view of a wafer of ISB emitters before being diced into individual devices/chips.

In order to extract heat from semiconductor light sources the devices are typically mounted on a heat sink. This approach is particularly important for lasers that are intended to operate cw and/or at relatively high power outputs. In accordance with one aspect of our invention, as shown in FIGS. 2 & 3, the source 10 is mounted epitaxial-side down; i.e., the epitaxial region 13 is closer to the heat sink 30 that the substrate 12. Said another way, the electrode 20 is soldered on the heat sink by means of a layer 40 of solder.

If the material of the heat sink 30 is an electrical insulator (e.g., diamond, SiC), then the mounting surface 30.2 is coated with an electrically conducting layer 50 (e.g., Au) that is wet by the solder used. On the other hand, if the material of the heat sink 30 is already an electrical conductor (e.g., Cu) that is wet by solder used, then layer 50 may be omitted.

Unlike the approach taken with conventional semiconductor lasers, which are cleaved only before being mounted on heat sinks, our sources/lasers are also cleaved after being mounted. Thus, in the prior art the already-cleaved laser is typically positioned so that its output facet is flush with an edge of the heat sink. Then it is soldered in place. In addition, in order to avoid inadvertent solder contamination of the output facet, the assembly of conventional lasers is designed so that the output facet extends beyond the end of the solder layer 40; e.g., the solder layer is recessed from the edge 30.1 of the heat sink, or, if the solder layer extends to edge 30.1, the laser chip slightly overhangs the edge 30.1. Either way, a small end portion of the laser chip is not thermally coupled well to the heat sink; i.e., it is un-heatsinked. However, since conventional lasers dissipate relatively low amounts of electrical power, this un-heatsinked portion of the laser tends not to be a problem.

In contrast, ISB lasers with a multiplicity of alternating RT and I/R regions (e.g., about 25–30 of each) dissipate much more power and, as a result, the un-heatsinked portion of the laser would tend to exhibit undesirable hot spots. Therefore, in accordance with one embodiment of our invention, as shown in FIGS. 2 & 3, source 10 is cleaved a first time to form the front (output) facet 10.1 and the back facet 10.2. Then the source/laser 10 is positioned so that the output facet 10.1 overhangs an edge 30.1 of the heat sink. The source/laser 10 is then soldered in place. After the solder cools and solidifies, the source is cleaved again to remove the overhanging piece of the device, thereby forming a new output facet 10.1' that is flush with the edge 30.1. In addition, electrically conducting material (either the heat sink itself or the layer 50 thereon) extends all the way to the edge 30.1 so that the solder layer 40 likewise extends to the edge and all portions of the epitaxial side of the laser chip are thermally coupled to the heat sink. Our approach ensures that no portion of the source/laser is out of contact with solder layer and hence the heat sink, thereby reducing the likelihood that hot spots will form.

Forming the output facet 10.1 flush with the edge 30.1 means that the divergent output beam from that facet is not significantly distorted in the far-field (as it would be if the laser chip were recessed from the edge 30.1 and the output beam reflected off of the protruding portion of the heat sink 30).

The back facet could be handled in the same way by making the heat sink narrower than the length of the source so that both facets overhang opposite, parallel edges of the heat sink. Alternatively, if the back facet 10 is not aligned with an edge of the heat sink, but rather is located interior thereto, as shown in FIGS. 2 & 3, then it should be protected from solder that might inadvertently creep onto the facet during the soldering operation. In accordance with another aspect of our invention, the back facet 10.2 is protected by a coating that prevents spurious portion 40.2 of solder layer 40 from making direct contact with the semiconductor material of the facet. Illustratively, the coating may be multi-layered, including, for example, an electrically insulating layer 10.2a ($SiO_2$) formed on the facet 10.2 and a metal layer 10.2b (e.g., Au) formed on layer 10.2a. Such a composite my serve the additional function of being, for example, a high reflectivity (HR) coating.

Finally, because ISB sources that have a relatively large number of alternating RT and I/R regions (e.g., about 25–30 of each) operate with much higher bias voltages than conventional semiconductor emitters, the problem of dielectric breakdown is much more severe. This problem is particularly acute at the edges of the source chip where the dielectric/insulating layer 18 (FIG. 1) is often damaged during processing (particularly during the dicing operations that are use to separate the wafer into chips or bars of chips). If the integrity of the edge of the layer is compromised, then the dielectric in that area may breakdown if the electrode 20 extends to the edge of the chip, as it does in prior art intersubband sources/lasers. (Prior art semiconductor emitters operate at sufficiently lower voltages (e.g., 1 V) that edge breakdown of this type is not a significant problem.) In accordance with yet another embodiment of our invention, however, the electrode 20 is designed so that there is a significant gap d (e.g., $d \geq 10$ μm, and as much as 100 μm in some cases) between adjacent electrodes formed on the insulating layer 18 while the devices are still in the wafer stage. That is the electrode 20 is recessed from the edges of the chip.

Illustratively, the electrode 20 is formed by a pair of rectangles 20v and 20h that intersect one another at right angles. As a result, the electrode 20 may have the shape of a cross, but other shapes are also suitable for use in the invention. Although the rectangles 20v and 20h are shown to be substantially identical to one another, they may be different; e.g., the horizontal rectangle 20h may be longer in its vertical dimension as shown by the phantom lines 20h', so that the protruding ends of the vertical rectangle 20v would be correspondingly shorter (unless the vertical dimensions of the latter are also increased).

In addition, the dielectric/insulating layer 18 is made of material (e.g., $SiO_2$) that is not wet by the solder 40 (e.g., In). In this fashion, the edges of the source 10 are not in electrical contact with the heat sink 30 and cannot short circuit the device. Using this approach, we have achieved device yields for epitaxial-side mounting that are nearly identical to yields for substrate-side mounting, but with, of course, improved higher temperature cw performance (e.g., cw operation at temperatures of at least 175 K).

EXAMPLES

These examples describe a Group III-V compound semiconductor ISB lasers fabricated using mounting technology in accordance with one embodiment of our invention. Various materials, dimensions and operating conditions are provided by way of illustration only and, unless otherwise expressly stated, are not intended to limit the scope of the invention.

All of the lasers described below were mounted on heat sinks using the following techniques, as described above: overhang & cleave to ensure that the front facet is flush with an edge of the heat sink; back facet coating of Au/$SiO_2$ to protect that facet from In solder contamination; and recessed top/mesa electrode with non-wetting insulating layer of $SiO_2$ to reduce the likelihood of dielectric breakdown.

Two types of QC lasers were used in this work: (1) 3 Quantum Wells—Vertical Transition (3 WV) active region QC lasers, emitting at 8 μm wavelength from wafer D2396, as described in a paper by C. Gmachl et al., *Appl. Phys. Lett.*, Vol. 72, No. 24, pp. 3130–3132 (June 1998), and from wafer D2405, as described by Gmachl et al., *J. Selected Topics in Quantum Electron.*, Vol. 5, No. 3, pp. 808–816 (May/June 1999), both of which are incorporated herein by reference, and (2) the best pre-biased SL QC lasers (from wafer D2433), emitting at 7.5 μm, as described by Tredicucci et al., *Appl. Phys. Lett.*, supra. Hereinafter, the designations of the wafer numbers D2396, D2405 and D2433 standing alone shall mean a laser that came from that particular wafer.

The 3 WV QC laser had the advantage of very low threshold current densities $J_{th}$ at low temperatures ($\leq 1$ kA/cm$^2$ for D2396), but a more rapid increase with temperature, described well by $J_{th}(T) \exp(T/T_0)$ with $T_0 \sim 130$ K. In contrast, the SL QC laser had a higher threshold current density at low temperatures (~2 kA/cm$^2$), but a lower one at room temperature. 3 WV lasers D2396 and D2405 contained 30 and 12 stages of alternating RT regions and I/R regions, which resulted in an operating bias of ~7 V and ~3.5 V, respectively. SL lasers D2433 contained 19 stages and displayed an operating bias ~6.5 V. (The operating bias is only weakly dependent on temperature.) Finally, 3 WV lasers D2396 had a binary (InP) top waveguide cladding, whereas 3 WV lasers D2405 and SL lasers D2433 had ternary (AlInAs/InGaAs) top cladding layers. The lower waveguide cladding in all of the lasers was the InP substrate. (InP has about a one order of magnitude larger thermal conductivity than the AlInAs alloy.)

As heat sink materials, both copper and diamond-sheet on copper were used, but no significant performance difference was observed between them. A calibrated Si-diode mounted directly on the laser heat sink was used to measure the heat-sink temperature. The lasers were operated using a cw current source, the light was collected with unity collection efficiency from the front facet and was detected using a thermopile photo-detector. Spectral measurements were performed using a Fourier Transform Infrared (FTIR) spectrometer.

Figure 5:
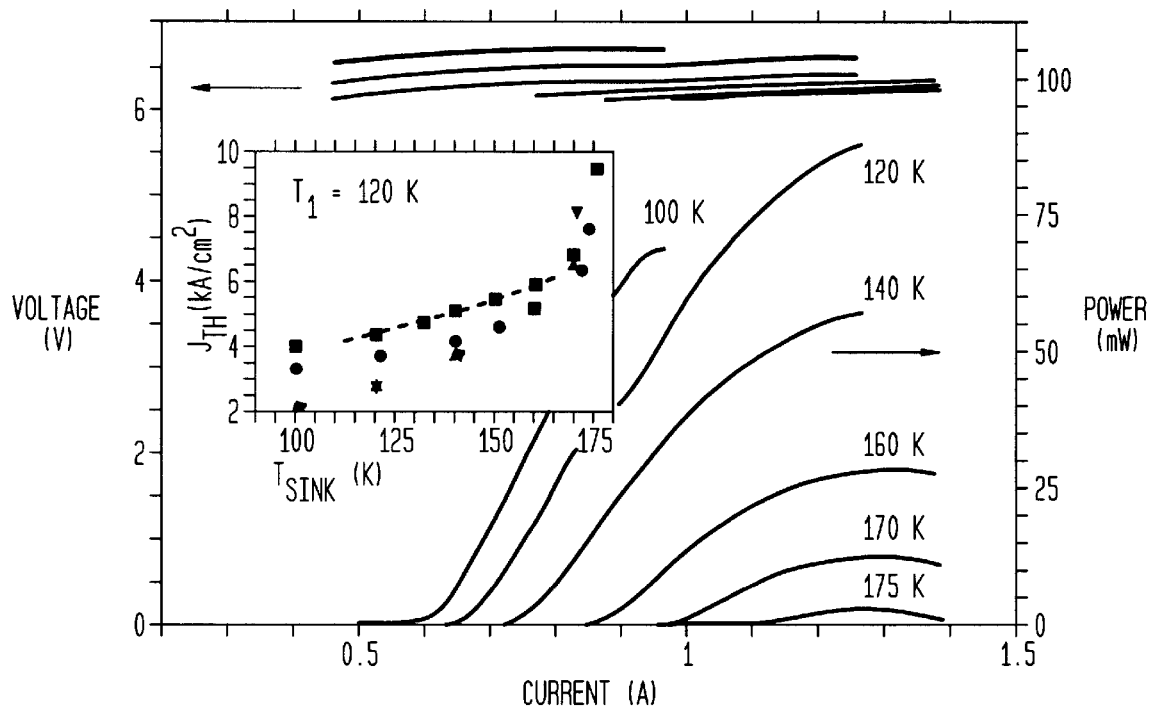
FIG. 5 shows characteristic graphs of optical power output and voltage versus current at various heat-sink temperatures of a representative chirped superlattice (SL) QC laser from wafer D2433. The stripe width of the laser was 9 $\mu$m; its length was 1.52 mm The laser was HR-coated on its back-facet and was mounted epitaxial-side down. It was operated in a cw mode. The inset shows the threshold current density ($J_{th}$) as a function of the heat-sink temperature for four different lasers. The dashed line is fitted to the data using: $J_{th}(T) \exp(T/T_1)$+const, where $T_1$ is a phenomenological constant (fitting parameter) that can be understood as a characteristic temperature.
Figure 6:
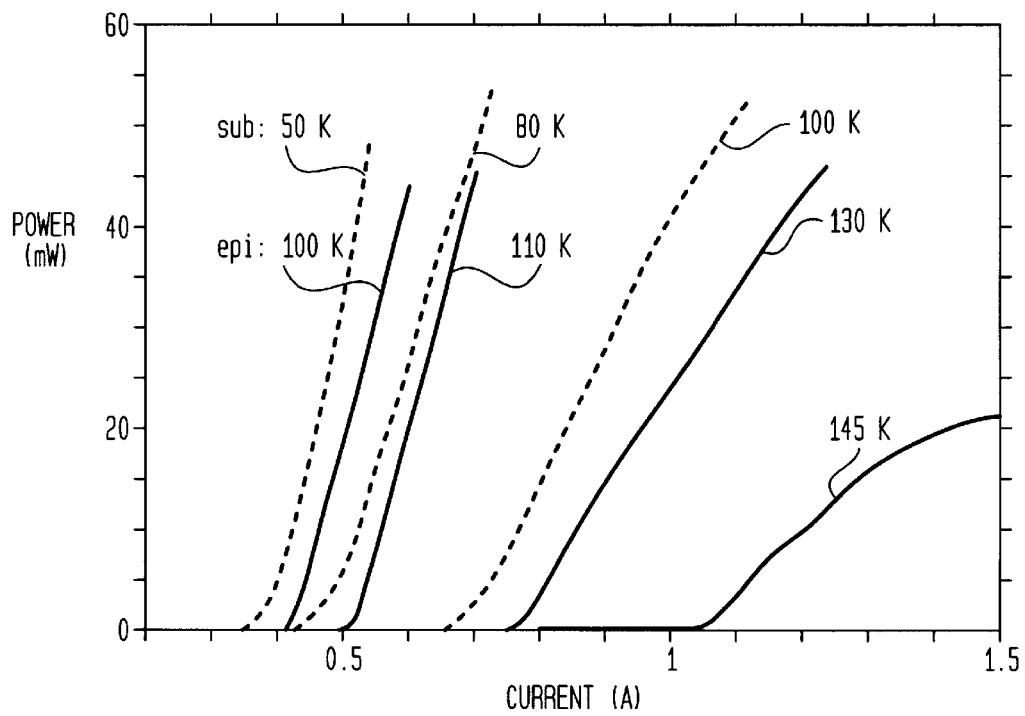
FIG. 6 is a graph of optical power versus current at various heat-sink temperatures for two comparable 3 WV (3-quantum-well, vertical transition) QC lasers from wafer D2396. Some of the lasers were mounted epitaxial-side down (solid lines labeled epi) and some were mounted substrate-side down (dashed lines labeled sub). As can be seen from the data, at comparable heatsink temperatures, epitaxial-side-mounted lasers show a clearly improved performance, similar to a substrate-side-mounted laser at an effectively 20 K lower heat-sink temperature.

Lasers mounted epitaxial-side down proved to be superior to those mounted substrate-side down. The maximum cw temperature was raised consistently by approximately 20 K, up to the record value of 175 K for SL laser D2433. Consequently, at comparable heat-sink temperatures, device performance with respect to threshold current, output power, and slope efficiency was greatly enhanced. FIG. 5 shows some of the best cw results for SL lasers D2433 and 3 WV lasers D2396. In the inset to FIG. 5, the threshold current density of four SL lasers D2433 as a function of the heat sink temperature is displayed. The data show an exponential increase of $J_{th}(T)$. However, at a temperature close to (i.e., within ~10 K of) the highest cw temperature the lasers show a much stronger increase in threshold current. We attribute this difference to a positive feedback loop between the temperature of the core region (i.e., the stack of alternating active regions and injector/relaxation regions) and the threshold current density. This feedback loop is first driven by the large amount of dissipated power in cw operation and finally enhanced by an increasingly strong temperature gradient in the structure, which ultimately shuts the laser off.

Figure 7:
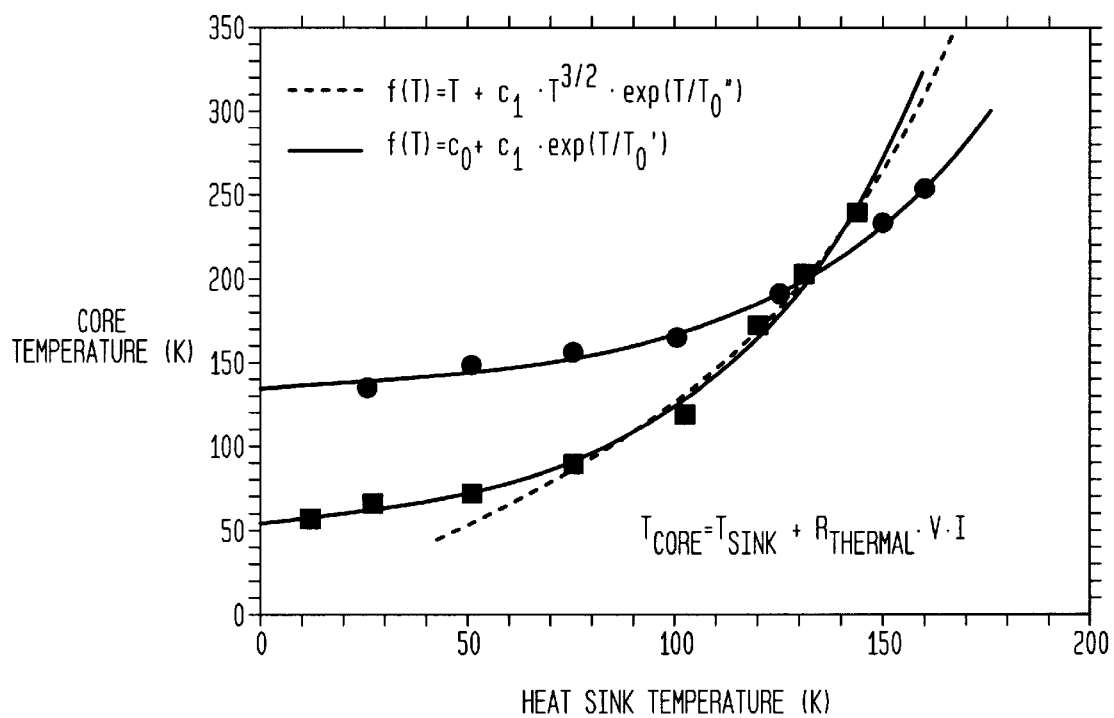
FIG. 7 is a graph of laser core temperature as a function of the heat-sink temperature of two representative QC lasers: an SL laser from wafer D2433 (circles) and a 3 WV laser from wafer D2405 (squares). Both were mounted epitaxial-side down on the heat sink. The core comprises an active region (a stack of radiative transition plus injector/relaxation regions). The data were extracted from spectral measurements on the devices under cw and pulsed mode operation, as described hereinafter. In steady state the core temperature $T_{core}$ is expected to rise above the heat sink temperature $T_{sink}$ by $VIR_{thermal}$, with $R_{thermal}$ being the thermal resistance, V the operating bias voltage and I the operating current, which was taken close to the threshold current. The dashed line was fitted to the data under the assumption of an exponential increase in current and a power-law increase in the thermal resistivity. The solid lines are empirical fit-functions using a single exponential only, which is reasonable as the two fit functions do not deviate much from one another at higher temperatures. In addition, the entire heat-sinking set-up operated less efficiently at very low temperatures, which was not included in the above basic assumptions. We obtained values of $T_0'$=50 K for lasers from wafer D2433, and $T_0'$=47 K and $T_0''$=57 K for lasers from wafer D2405. ($T_O'$ and $T_0''$ are also phenomenological constants similar to $T_1$. discussed above.) These values are different from—and clearly lower than—values of $T_0$ (or, where applicable, $T_1$) obtained for the dependence of the pulsed threshold current density on the core or heat-sink temperature. This difference is explained by the fact that the plot of $T_{core}$ versus $T_{sink}$ already includes the positive feedback loop (driven by the dissipated power) of elevated core temperature and cw threshold current. Extrapolation of the data showed that at the maximum cw operating temperatures, $T_{sink}$=165 K and 175 K for lasers from wafers D2405 and D2433, respectively, the core temperature had reached values $\geq$300 K, where the laser operation also ceased in pulsed operation; i.e., under low thermal load, where $T_{sink} \approx T_{core}$.

The core temperature was determined by comparing spectra obtained in cw and pulsed operation with short ($\leq 50$ ns) pulses and a low ($\leq 0.5\%$) duty cycle. Given the latter we assumed that the core temperature was equal to the heat-sink temperature in pulsed conditions, thus providing a calibration of wavelength versus temperature, which was then used to determine the core temperature from the cw spectra. Data are shown in FIG. 7 for a 3 WV QC laser D2405 and a SL QC laser D2433, both mounted epitaxial-side down on the heat-sink. From both data sets it is apparent that the maximum cw heat sink temperatures, 165 K and 175 K for the 3 WV QC and SL QC laser, respectively, correspond to core temperatures $\geq 300$ K, close to the highest operating temperature for the devices in pulsed operation.

An active region temperature that is too high can have several adverse effects on the performance of QC-lasers as discussed, for example, in papers by Tredicucci et al., supra, and by S. Slivken et al., *J. Appl. Phys.*, Vol. 85, No. 2, pp. 665–671 (January 1999), which is incorporated herein by reference.

Mounting ISB lasers epitaxial-side-down in accordance with out invention, however, reduces the amount by which the temperature of the core region rises above that of the heat sink. Theory suggests that a factor of about 2–3 times smaller temperature increase is possible, but experiment demonstrates a smaller (20 K), yet significant, improvement.

In order to better understand the behavior of our lasers under cw operation, we have calculated the temperature profiles (FIG. 8) across a 3 WV laser D2396 mounted epitaxial-side down (curve b) and substrate-side down (curve a) on a the heat sink. The calculation was performed by solving the two-dimensional, non-linear differential equation for the heat-flow through a layered medium using the finite element method (employing a commercial software package). It is evident, that epitaxial-side-down mounting should greatly improve device performance and raise the maximum cw operating temperature (i.e., the maximum temperature before the laser turns off). The temperature of the active region of the device rises over the heat sink temperature by a factor of 2–3 less when the laser is mounted epitaxial-side down, as compared to the same laser mounted substrate-side down. The results for the substrate-side mounted laser also agree well with the measurements. At the maximum cw heat sink temperature where laser action is detected (145 K), the core region is approximately at room temperature.

Modeling of the epitaxial-side-down lasers did not yield as good agreement with the data. This difference is explained by the uncertainty in the material parameters, in particular the dependence of the thermal conductivity on the doping level, and by some simplifications made in the model. For example, the top waveguide cladding—assumed to be homogeneous—in fact consists of several layers. Furthermore, the waveguide core region—assumed to be bulk-like in the model—consists of many, typically ~500 very thin layers (each only several nanometers thick), which may in turn reduce the thermal conductivity normal to the layers. Of course, imperfect mounting—such as, for example, air-inclusions in the solder—may also contribute to the temperature discrepancy.

Figure 8:
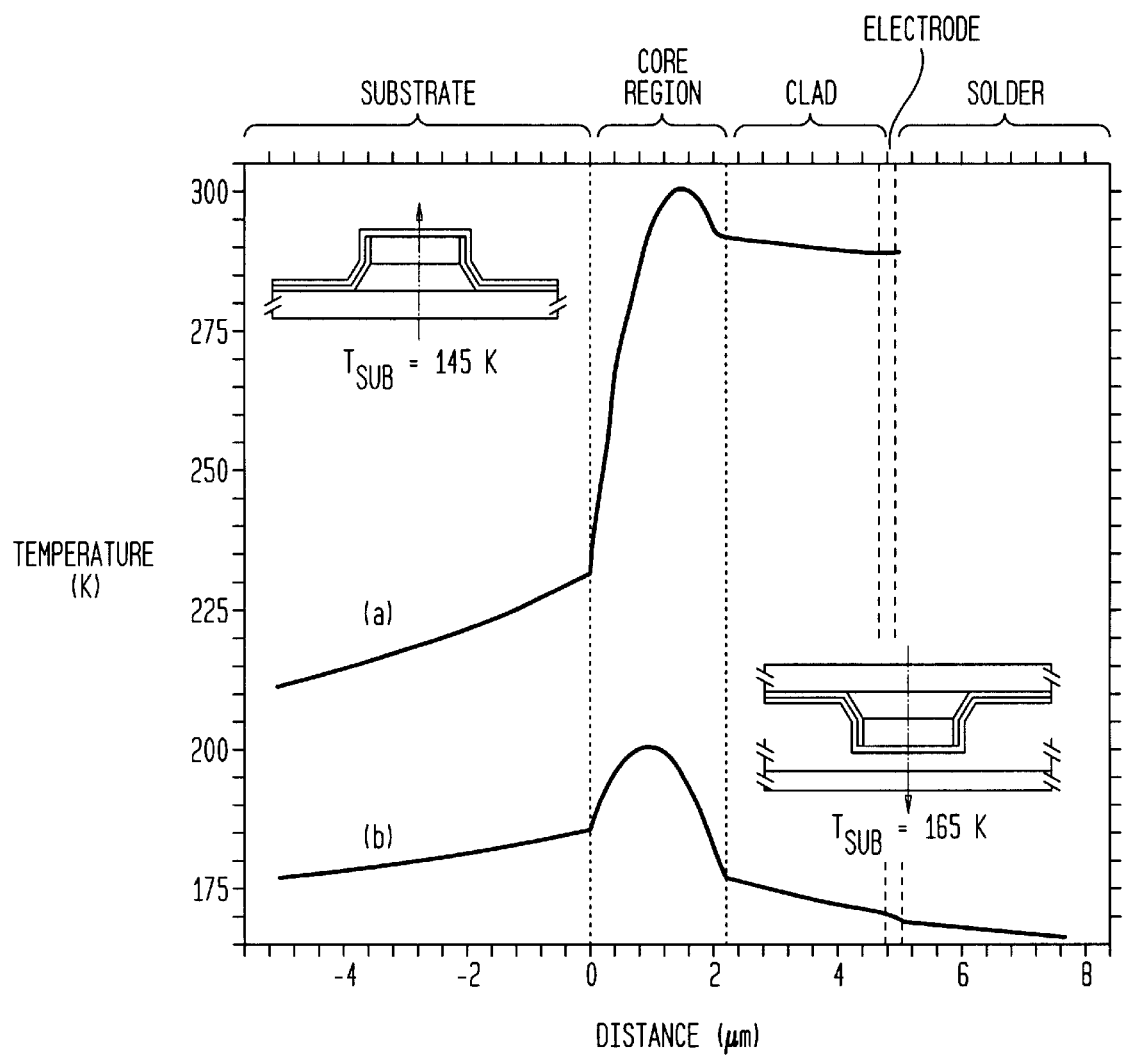
FIG. 8 is a graph of calculated temperature profiles along the vertical direction (indicated by dashed arrows in the insets) of a representative 3 WV QC laser from wafer D2396 mounted substrate-side down (a) and epitaxial-side down (b) on the heat sink. The calculations were performed for the maximum cw heat-sink temperatures obtained for this sample under the two mounting conditions; i.e., 145 K and 165 K, respectively. The lightly shaded region indicates the core region of the laser.

One striking feature emerging from the model is the strong temperature gradient across the core region (RT regions plus I/R regions). If different stages of the latter are at different temperatures, a further decrease in device performance is expected. In particular, if some (usually the hottest) stages are too severely compromised to reach laser threshold, the confinement factor (i.e., the overlap of the mode intensity profile with the RT regions) is effectively decreased. The resulting increased threshold current leads to a larger dissipated power, which in turn causes a higher core temperature (and temperature gradient), which gives rise to a positive feedback loop eventually causing the laser to shut off Model calculations as shown in FIG. 8 yield very similar results also for SL lasers D2433 and therefore are not shown.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, our invention is applicable to ISB lasers that are provided with means other than, or in addition to, a pair of cleaved facets for providing optical feedback. For example, DFB ISB lasers, which would still have cleaved facets (although they might be anti-reflection (AR) coated), are expected to benefit from being mounted in accordance with our inventive techniques.

What is claimed is:

1. A method of fabricating an intersubband semiconductor light emitter comprising the steps of:
   (a) providing a single crystal semiconductor substrate,
   (b) forming on said substrate an epitaxial region that includes a core region and an intersubband active region in said core region,
   (c) forming front and back facets on opposite ends of said active region,
   (d) forming a metal electrode on said epitaxial region so as to provide an electrical connection to said active region, and
   (e) mounting said laser on a surface of a heat sink, characterized in that
   said mounting step (e) includes the steps of (e1) soldering said electrode to said heat sink so that said front facet overhangs an edge of said heat sink and (e2) cleaving off the overhanging portion of said laser so as to form a new front facet that is essentially flush with said edge of said heat sink.

2. The invention of claim 1 wherein said mounting step (e) includes designing said heat sink so that said surface is electrically conducting all the way to said edge and said soldering step (e1) causes said solder to adhere to said surface and to extend all the way to said edge.

3. The invention of claim 1 wherein said epitaxial region forming step (b) includes the steps of (b1) forming upper and lower cladding regions bounding said core region, (b2) forming at least said upper cladding region and said active region in the shape of an elongated mesa, said mesa having said front and back facets at opposite ends thereof and having sidewalls and a top surface, (b3) forming a patterned first insulating layer over said mesa, said first layer having an opening that exposes said top surface, and wherein said electrode forming step (d) includes the step of (d1) forming said electrode on said first layer and on said top surface.

4. The invention of claim 3 wherein said electrode forming step includes the step (d2) of recessing said electrode from the edges of said emitter.

5. The invention of claim 1 wherein said facet forming step (c) includes the steps of (c1) forming an insulating second layer on said back facet and (c2) forming a metal layer on said second layer so that any solder that would tend to flow onto said back facet contacts said metal layer and not the semiconductor material of the back facet.

6. The invention of claim 1 wherein said epitaxial region forming step (b) includes forming said core and active regions of Group III-V compound semiconductor materials.

7. The invention of claim 3 wherein said soldering step (e1) and said first layer forming step (b3) are mutually adapted so that the material of said first layer is not wet by the solder used in soldering step.

8. The invention of claim 7 wherein said soldering step (e1) includes soldering said emitter to said heat sink using In-based solder.

9. The invention of claim 4 wherein said electrode forming step (d2) includes the step of recessing said electrode from the edges of said emitter by a distance of at least 10 $\mu$m.

10. The invention of claim 9 wherein said electrode forming step (d2) includes the step of recessing said electrode from the edges of said emitter by a distance of about 100 $\mu$m.

11. The invention of claim 1 wherein said electrode forming step (d) forms said electrode in the shape of a pair of intersecting rectangles.

12. A method of fabricating an intersubband semiconductor laser comprising the steps of:
(a) providing a single crystal semiconductor substrate,
(b) forming on said substrate an epitaxial region that includes a core region and an intersubband active region in said core region, said forming step (b) including the steps of (b1) forming upper and lower cladding regions bounding said core region, (b2) forming at least said upper cladding region and said active region in the shape of an elongated mesa having sidewalls and a top surface, (b3) forming a patterned first insulating layer over said mesa, said first layer having an opening that exposes said top surface, and wherein said electrode forming step (d) includes the step of (d1) forming said electrode on said first layer and on said top surface,
(c) forming front and back facets on opposite ends of said mesa so as to define an optical cavity resonator, said active region being disposed in said resonator,
(d) forming a metal electrode on said sidewalls and top surface of said mesa so as to provide an electrical connection to said active region, and
(e) mounting said laser on a surface of a heat sink, characterized in that
said mounting step (e) includes the steps of (e1) soldering said electrode to said heat sink with In-based solder so that said front facet overhangs an edge of said heat sink and (e2) cleaving off the overhanging portion of said laser so as to form a new front facet that is essentially flush with said edge of said heat sink,
said mounting step (e) includes designing said heat sink so that said surface is electrically conducting all the way to said edge and said soldering step (e1) causes said solder to adhere to said surface and to extend all the way to said edge,
said forming step (b3) includes the step of forming said insulating layer from a material that is not wet by said In solder,
said electrode forming step (d) includes the step of recessing said electrode from the edges of said laser by a distance of at least 10 $\mu$m, and
said facet forming step (c) includes the steps forming an insulating second layer on said back facet and forming a metal layer on said second layer so that any solder that would tend to flow onto said back facet contacts said metal layer and not the semiconductor material of the back facet.

* * * * *